(12) United States Patent
Levinski et al.

(10) Patent No.: US 7,526,749 B2
(45) Date of Patent: Apr. 28, 2009

(54) METHODS AND APPARATUS FOR DESIGNING AND USING MICRO-TARGETS IN OVERLAY METROLOGY

(75) Inventors: Vladimir Levinski, Nazareth Ilit (IL); Michael E. Adel, Zichron Ya'akov (IL); Aviv Frommer, Misgav (IL); Daniel Kandel, Aseret (IL)

(73) Assignee: KLA-Tencor Technologies Corporation, Milpitas, CA (US)

( * ) Notice: Subject to any disclaimer, the term of this patent is extended or adjusted under 35 U.S.C. 154(b) by 276 days.

(21) Appl. No.: 11/329,716

(22) Filed: Jan. 10, 2006

(65) Prior Publication Data
US 2007/0096094 A1     May 3, 2007

Related U.S. Application Data

(60) Provisional application No. 60/732,433, filed on Oct. 31, 2005.

(51) Int. Cl.
  *G06F 17/50* (2006.01)
(52) U.S. Cl. .......... 716/21; 716/4; 716/5; 716/19; 716/20
(58) Field of Classification Search .......... 716/4, 716/5, 19–21; 257/48; 438/14, 16; 356/399–401, 356/614; 430/5, 22, 30
See application file for complete search history.

(56) References Cited

U.S. PATENT DOCUMENTS

| | | | | |
|---|---|---|---|---|
| 6,982,793 | B1 * | 1/2006 | Yang et al. | 356/401 |
| 7,075,639 | B2 * | 7/2006 | Adel et al. | 356/237.5 |
| 7,289,214 | B1 * | 10/2007 | Li et al. | 356/401 |
| 2003/0212525 | A1 * | 11/2003 | Bischoff et al. | 702/127 |

OTHER PUBLICATIONS

WO International Search Report mailed Jul. 17, 2008 from International Application No. PCT/US06/41514; and Written Opinion of the International Searching Authority mailed Jul. 17, 2008 from International Application No. PCT/US06/41514, 16 pages.

* cited by examiner

*Primary Examiner*—Vuthe Siek
(74) *Attorney, Agent, or Firm*—Weaver Austin Villeneuve & Sampson LLP

(57) ABSTRACT

Methods and apparatus for fabricating a semiconductor die including several target structures. A first layer is formed that includes one or more line or trench structures that extend in a first direction. A second layer is formed that includes one or more line or trench structures that extend in a second direction that is perpendicular to the first structure, such that a projection of the target structure along the first direction is independent of the second direction and a projection of the target structure along the second direction is independent of the first direction. A target structure and a method for generating a calibration curve are also described.

4 Claims, 7 Drawing Sheets

METHODS AND APPARATUS FOR DESIGNING AND USING MICRO-TARGETS IN OVERLAY METROLOGY

CROSS REFERENCE TO RELATED APPLICATIONS

The present application claims priority under 35 U.S.C. §119(e) from U.S. Provisional Patent Application No. 60/732,433 entitled "METHODS AND APPARATUS FOR USING MICRO-TARGETS IN OVERLAY METROLOGY" filed Oct. 31, 2005, the entire disclosure of which is incorporated herein by reference for all purposes.

BACKGROUND

The present invention relates to the field of semiconductor metrology and inspection. More specifically, it relates to techniques for providing and using targets for metrology and/or inspection.

Generally, the industry of semiconductor manufacturing involves highly complex techniques for fabricating integrating circuits using semiconductor materials which are layered and patterned onto a substrate, such as silicon. Due to the large scale of circuit integration and the decreasing size of semiconductor devices, the device must be defect free prior to shipment of the device to the end users or customers.

The measurement of overlay and alignment error on a wafer is one of the most critical process control techniques used in the manufacturing of integrated circuits and devices. Overlay accuracy generally pertains to the determination of how accurately a first patterned layer aligns with respect to a second patterned layer disposed above or below it. Alignment error relates to the determination of how accurately a first pattern aligns with respect to a second pattern disposed on the same layer. The terms overlay and alignment are used herein interchangeably. Presently, overlay and alignment measurements are performed via test patterns that are printed together with layers of the wafer. The images of these test patterns are captured through an imaging tool and an analysis algorithm is used to calculate the relative displacement of the patterns from the captured images.

As overlay targets become increasingly smaller, e.g., below 3 µm, proximity effects arise. By way of example, a symmetry parameter measured on a conventional target (e.g., such as a box-in-box) is independent of overlay, as opposed to smaller targets where asymmetry is a function of overlay. Of note, this correlation between overlay and the measured symmetry parameter of a smaller target is very weak for lower values of overlay. Thus, it becomes impossible to correlate a measured symmetry parameter to overlay at lower overlay values. In "In-chip overlay measurement by existing brightfield imaging optical tools," by YI-sha Ku, Chi-Hong Tung and Smith, Nigel P., Proceedings of SPIE, 2005, the authors have proposed inducing a predetermined offset in each target to achieve a stronger correlation between a symmetry parameter measured in the target image and the actual overlay error of the target. This technique requires a model to build a relationship between the measured symmetry parameter and overlay. A problem with this technique is that the calibration for determining overlay in an x direction is not decoupled from the calibration for determining overlay in a y direction. Thus, a complex, time consuming calibration procedure for the targets in a two dimensional space is required.

Accordingly, there is a need for improved techniques for designing an overlay target that allow the determination of overlay for such target by correlating a measured symmetry parameter to overlay without requiring complex modeling procedures in both x and y directions. Simplified calibration techniques for correlated measured symmetry to overlay would also be beneficial.

SUMMARY

Generally, the invention provides a design for designing targets used in overlay metrology as "micro targets" that have no coupling between overlay shifts in the x and y directions. This decoupling allows the micro targets to be imaged to measure a symmetry parameter that can be readily correlated with overlay, as well as generating calibration curves for overlay measurements, even during the measurements itself. The micro targets can be easily integrated within the active regions of a semiconductor die to be more reliably and accurately inspected or measured to determine whether there are any defects or whether a process is deviating out of specification, as compared with conventional targets placed within special test areas or within the scribe line. In its simplest embodiment, the micro target is constructed from intersecting features belonging to the two successive process layers, where the first layer structure extends in a one direction and the second layer structure extends in an another direction, typically orthogonal to the first direction. Cross shaped targets are the simplest examples of such intersecting structure targets. The image projection along the first direction (for example, along an x-axis) can be used for OVL measurements in the first direction (x-OVL measurements), and the image projection along the second direction (for example, along an y-axis) can be used for OVL measurements in the second direction (y-OVL measurements).

Generally, using targets with intersecting features enables the use of either dummy fill structures of the two successive layers which, in some implementations, can be simple rectangles that are designed to intersect each other or, in other implementations, can be actual device structures of the semiconductor wafer. Intersecting features in two successive process layers occur in actual device structures in multiple process steps. Often the typical layout of successive process layers is simply a right angle cross-shaped structure. Such structures often form basic features that appear very frequently on most parts of the semiconductor wafer area. Two examples of such structures include (i) a basic cross shaped gate stack over an active area in the formation of a transistor using CMOS technology, and (ii) two successive metal layers that typically form conducting wires in orthogonal directions.

Generally, the invention also provides three types of approaches for model building and overlay measurement. In the first approach, an array of micro targets with predefined overlay values are printed in a specific place on a wafer. A calculation of the target asymmetry parameter for each one of the targets in the array is performed, and a calibration curve is determined by setting a zero overlay value to correspond to the center of symmetry for the curve. The obtained calibration curve can then be used as a reference in overlay measurements for a single micro-target placed within the active area or any other suitable area of the wafer.

In the second approach, an array of targets with predefined overlay values is printed within the active area, for example, as a set of inactive dummy structures. The targets are subjected to an overlay shift, and a parameter of symmetry is measured for each of the printed targets. Due to the symmetric nature of the overlay curve, this makes it possible to determine the overlay shift.

The third approach is based on modeling similar to the approach used in optical CD (critical dimension) measurements. Simulation software can be used to numerically calculate the asymmetry of the micro target as a function of overlay. The input to the simulation software is the design of the target (for example, in a GDS format). The result of the simulation can be used as an effective calibration curve. The simulation software can include an electromagnetic scattering module as well as process simulation modules (for example, lithography, etch, or CMP simulators), and simulates all the relevant physical phenomena that influence the structure of the overlay target. In the event that this third calibration scheme is not sufficiently sensitive for overlay values close to zero, an additional predefined overlay can be introduced for small overlay values, which is common to all the targets used in OVL measurement. Since this additional OVL shift is known, it can be subtracted after the overlay measurement, which results in the small overlay values corresponding to points along the calibration curve far from the center of symmetry, and give rise to an enhanced sensitivity.

In order to establish the calibration curve when using actual device structures as the overlay target, it is necessary to take into account that actual device structures can appear in a variety of forms and dimensions in the wafer die. Therefore, the calibration curve structures are designed to exactly match the intersecting structures which are most widespread across the wafer die and are used as the overlay target. Targets suitable for OVL measurements can be drawn out of the actual design data files such as the layout files (typically GDS format files).

In general, in one aspect, the invention provides a semiconductor target for determining overlay. The semiconductor target includes one or more line or trench structures in a first layer that extend in a first direction and one or more line or trench structures in a second layer that extend in a second direction that is perpendicular to the first structure such that the structures from the two layers intersect, so that overlay in the first direction does not affect an image symmetry in the second direction and vice versa.

Advantageous implementations can include one or more of the following features. The target can include a single line or trench in the first layer and a single line or trench in the second layer. The target can extend less than 3 µm in each of the first and second directions. The target can be formed in an active region of a semiconductor region. The one or more line structures of the first and second layer can be inactive dummy structures. The one or more line structures of the first and second layer can be structures of a device being formed on the semiconductor wafer.

In general, in one aspect, the invention provides methods and apparatus, including computer program products, implementing and using techniques for fabricating a semiconductor die including several target structures. A first layer is formed that includes one or more line or trench structures that extend in a first direction. A second layer is formed that includes one or more line or trench structures that extend in a second direction that is perpendicular to the first structure, such that a projection of the target structure along the first direction is independent of the second direction and a projection of the target structure along the second direction is independent of the first direction.

In general, in one aspect, the invention provides methods and apparatus, including computer program products, implementing and using techniques for generating a calibration curve for use in an overlay measurement. A first array of targets is printed on a wafer. A target asymmetry parameter value is calculated for each of the targets in the array of targets. A first calibration curve including the calculated target asymmetry parameter values to be used as a reference in overlay measurements for individual targets is generated, wherein a center of symmetry of the curve corresponds to a zero overlay.

Advantageous implementations can include one or more of the following features. A first portion of each target is printed in a first layer of the wafer, and a second portion of each target is printed in a second layer of the wafer. Printing an array of targets can include printing three targets with predefined overlay values. The printed targets can be subjected to an additional overlay shift and using the symmetry of the calibration curve with respect to the overlay value can be used to measure corresponding overlay values for a set of fictive targets having the opposite sign of the additional overlay shift. Generating the calibration curve can includes using the overlay values for the printed targets and the fictive targets to determine a center of symmetry corresponding to a zero overlay.

Printing can includes printing the targets in the first array in arbitrary order within an active region of the wafer, measuring a symmetry parameter value for each target, and sorting the targets using the measured symmetry parameter values. A second array of targets can be printed on a wafer, wherein the pitch of the first array of cross-shaped targets is different from a pitch of the second array of targets. A second calibration curve can be generated, including the calculated target asymmetry parameter values for the second array of targets, wherein a center of symmetry of the curve corresponds to a zero overlay. A distance between the respective centers of symmetry can be measured for the first and second calibration curves and an overlay value can be calculated based on the distance between the respective centers of symmetry of the first and second arrays, the ratio of difference in overlay offsets between the subsequent targets, and the target array pitch. Alternatively a second array of targets can be printed, wherein a first portion corresponding to the first portion of the targets in the first array is printed in the second layer, and a second portion corresponding to the second portion of the targets in the first array is printed in the first layer. Printing a second array can include printing a second array of targets having the same absolute offset values as the targets in the first array of targets, but having an opposite sign.

Printing can include printing both the first and second target arrays in arbitrary order within an active region of the wafer, measuring a symmetry parameter value for each target in each of the first and second target arrays, and sorting the targets within each of the first and second target arrays using the measured symmetry parameter values. The targets can be cross-shaped targets and each target in the array of targets can have a different offset between the horizontal and the vertical bars forming the cross.

Implementations of the invention can provide one or more of the following advantages. The target design embodiments described herein provide a decoupling between overlay shifts in the x and y directions. This decoupling technique allows targets to be designed as micro targets that can then be imaged to measure a symmetry parameter that can be readily correlated with overlay. As a result calibration curves for overlay measurements can be generated, even "on the fly." These micro targets may also be easily integrated within the active regions of a semiconductor die to be more reliably and accurately inspected or measured to determine whether there are any defects or whether a process is deviating out of specification, as compared with conventional targets placed within special test areas or within the scribe line. The target embodiments that are integrated within the die itself better represent the active region structures. For instance, the targets can have a same feature dimensions as the die features and will likely result in the same defects and process problems as the die features. Accordingly, the targets may be used to more accurately predict product yield (e.g., yield of the active structures).

The details of one or more embodiments of the invention are set forth in the accompanying drawings and the description below. Other features and advantages of the invention will be apparent from the description and drawings, and from the claims.

DESCRIPTION OF THE DRAWINGS

Like reference symbols in the various drawings indicate like elements.

DETAILED DESCRIPTION

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that the description is not intended to limit the invention to the described embodiments. On the contrary, the description is intended to cover alternatives, modifications, and equivalents as can be included within the spirit and scope of the invention as defined by the appended claims. In the following description, specific details are set forth in order to provide a thorough understanding of the present invention. The present invention can be practiced without some or all of these specific details. In addition, well known features may not have been described in detail to avoid unnecessarily obscuring the invention.

Although the target embodiments described herein may be placed in any suitable locations, such as in the scribe line, these invention target designs can be readily sized to form "micro" targets (such as less than 3 µm) to be utilized in-chip within the active die area. U.S. patent application Ser. No. 10/858,836 entitled "Apparatus and methods for providing in-chip micro-targets for metrology or inspection" by Cohen et al. and filed on Jun. 1, 2004, provides a description of various types of in-chip overlay metrology techniques, in which the overlay marks are inserted within the die, and is hereby incorporated herein by reference in its entirety.

Figure 1A:
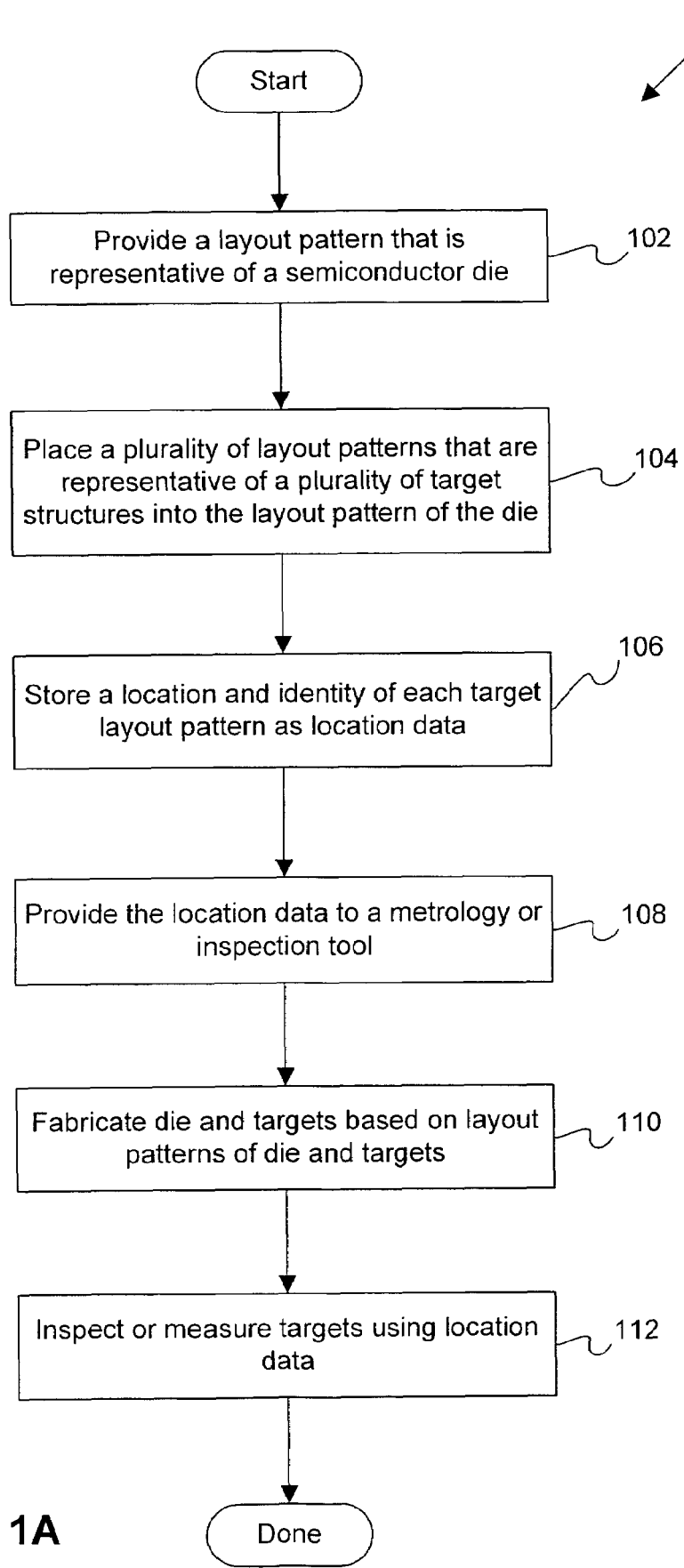
FIG. 1A is a flowchart illustrating a procedure for generating a layout pattern and inspecting targets fabricated from such layout pattern in accordance with one embodiment of the present invention.

FIG. 1A is a flowchart illustrating a procedure 100 for generating a layout pattern and inspecting targets fabricated from such layout pattern in accordance with one embodiment of the present invention. Initially, a layout pattern that is representative of a semiconductor die is provided in operation 102. A plurality of layout patterns that are representative of a plurality of target structures are then placed or integrated into the layout pattern of the die in operation 104. Operations 102 and 104 may be performed together or in a reverse order than the illustrated embodiment. The die and target patterns may be integrated based on a set of rules, which have been described in detail in the above referenced patent application.

An integrated circuit (IC) device and target structure may be designed using any suitable design techniques. For example, an IC designer may use preexisting schematic library blocks to form the IC device and targets using, for example, electronic design automation (EDA) tools. In some cases, the IC designer may create an entire IC device target or part of an IC device or target from scratch with the aid of any suitable design system, such as conventional computer aided design (CAD) tools. For example, the IC designer may use a schematic CAD tool to plan the logic diagrams for a particular IC device or target. Still further, the IC designer may write a description of the IC device or target or portions of the IC device or target with the aid of a hardware design language, such as VHDL.

The IC designer then typically generates a layout pattern from the IC circuit design. The layout pattern may be composed of a plurality of electronic representations of IC layers that are later converted into a plurality of reticles that are used to fabricate a plurality of physical layers of an IC device and target. Each physical layer of the fabricated IC device corresponds to one of the reticles and an associated one of the electronic representations from the layout pattern. For example, one electronic representation may correspond to a diffusion pattern on a silicon substrate, another to a gate oxide pattern, another to a gate polysilicon pattern, another to a contact pattern on an interlayer dielectric, another to a line pattern on a metallization layer, and so on. The targets may be formed from any combination of one or more layers. For example, a special layer may be reserved for the target structures, or the targets may be formed from the dummy layer. Each electronic representation is composed of a plurality of polygons or other shapes (herein, referred to as "figures"), which together define the layout or reticle pattern.

The layout pattern may be generated using any suitable technique, for example, by using EDA or CAD tools. For example, the IC designer may manually lay out the layout patterns for the IC device and targets with or without preexisting library cells. Alternatively, a synthesis tool may automatically create layout patterns for the IC device and targets from scratch or by piecing together preexisting library cells based on the schematic design.

A location and identity of each target layout pattern is also stored as location data in operation 106. The location of a particular target may be stored in any suitable format for identifying a position of the particular target. For example, the location may take the form of Cartesian or polar coordinates. The identity is generally used to distinguish between different types of targets. It may take the form of alphanumeric text which identifies the type of target, such as overlay, CD, etc., or the identity may take the form of a reference to a target image.

The location data is provided to a metrology or inspection tool in operation 108. The location data may be provided directly or indirectly through another entity, such as a database or controller. That is, the location data may be output by the CAD module and input or uploaded into a particular inspection or metrology tool. Alternatively, the location data may be stored within the fabrication database which is accessible by the various process, inspection, review, and metrology tools. The location data may be stored in a format that is readable or accessible by a particular inspection, review, or metrology tool. For example, the location data may be in Open Access format, which is readable by inspection and metrology tools from KLA-Tencor.

The die and targets are then fabricated based on the layout patterns of the die and targets in operation 110. Reticles are first produced using the layout patterns. Each reticle corresponds to one or more electronic representation(s) from the circuit pattern database. The reticles may be produced by any suitable pattern generator or reticle writer equipment, such as a MEBES 4500, commercially available from ETEC of Hayward, Calif.

After the die and targets are at least partially fabricated, the targets and/or reticles may then be inspected or measured using the location data in operation 112. Any suitable inspection, review, or metrology tool may be utilized during any stage of the fabrication. Each tool may take the form of an optical system, such as a bright field or dark field optical system. The tool may also utilize both bright field and dark field modes. Examples of bright field systems include the 2350, 2351, 2360, and 2370 from KLA-Tencor, Corp. of San Jose, Calif. Examples of dark field system include the AIT II, AIT XP, Fusion, Fusion UV, and SPI PatternPro available from KLA-Tencor, Corp. of San Jose, Calif. The KLA 301 or 351 Reticle Inspection Tool may be used to inspect reticles. Each tool may also take the form of an electron beam (ebeam) system, such as a scanning, snapshot, or step-and-repeat type ebeam system. Examples of ebeam systems include the eV300 and eS20XP available from KLA Tencor, Corp. of San Jose, Calif. A tool may be designed to detect special types of defects, such as macro defects across a large area of the sample, defects on a bare substrate, or defects within solder bums (e.g., ball grid array bumps). Each tool may also be stand alone or integrated within a processing tool.

Figure 1B:
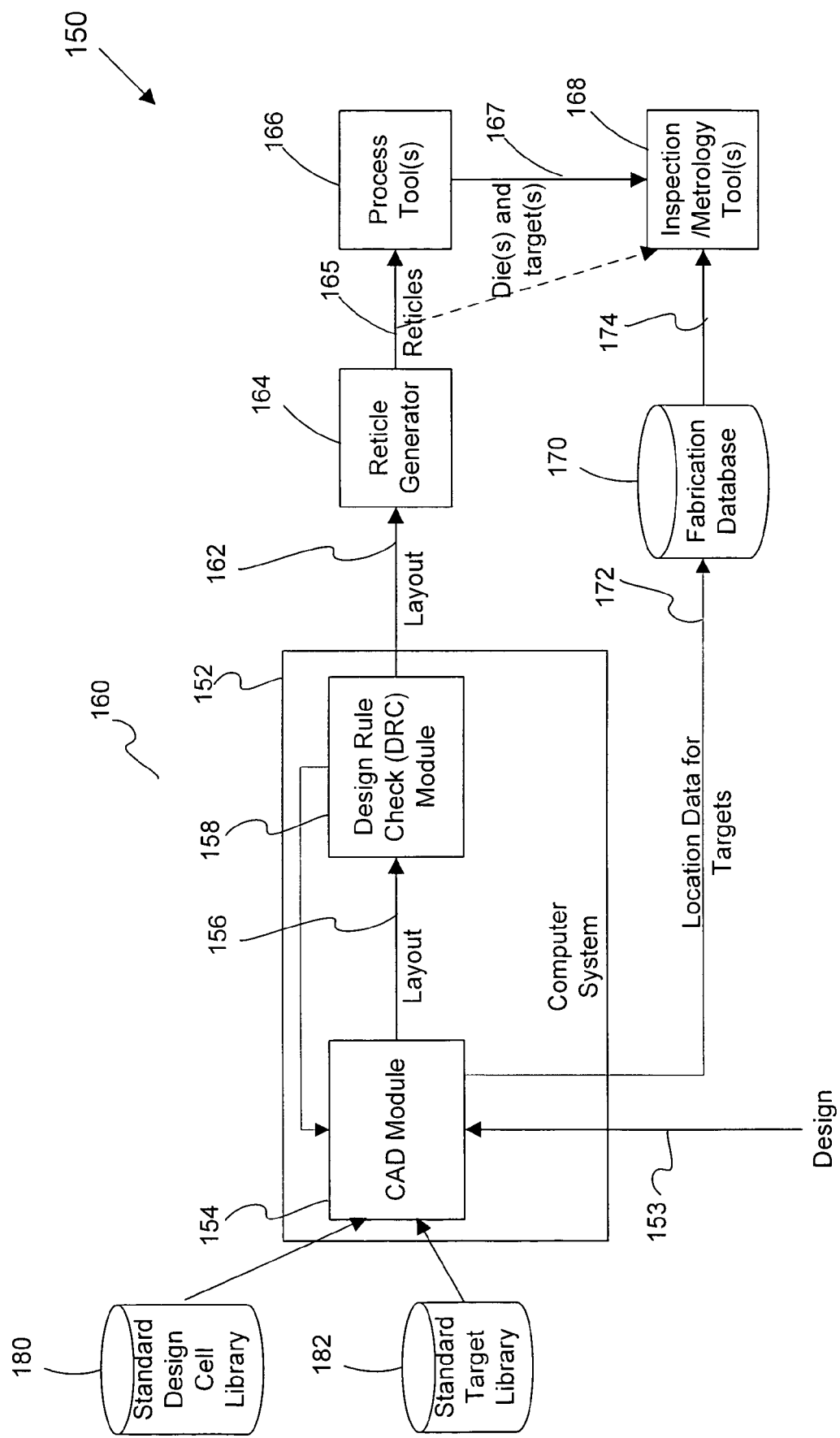
FIG. 1B is a diagrammatic representation of a design, fabrication, and metrology or inspection system in accordance with one embodiment of the present invention.

FIG. 1B is a diagrammatic representation of a design, fabrication, and metrology or inspection system 150 in accordance with one embodiment of the present invention. As shown, a design 153 of a die and targets is input into a computer aided design (CAD) module 154. This CAD module 154 may also have access to one or more databases containing standard layout patterns. In the illustrated embodiment, a standard design cell library 180 includes layout patterns for features within the active regions of the die and a standard target library 182 includes a number of different standard target layout patterns.

The CAD module 154 is generally configured to generate a layout pattern either automatically or via input from a design engineer. Several suitable CAD products for designing IC products are available from Cadence of San Jose, Calif. and Mentor Graphics of Wilsonville, Oreg. The layout pattern 156 is then checked by a design rule check (DRC) module 158. The DRC module is generally configured to determine whether the layout 156 conforms to a set of layout constraints. A feedback pathway 160 is provided to CAD module 154 for modification of the layout pattern 156 when the layout pattern fails to conform to the DRC. For example, the DRC module may indicate a number of nonconforming layout regions which may be modified to comply with the design rules. As shown, the CAD module and DRC module are contained within the same computer system 152. Of course, the CAD module and DRC module may be implemented in any suitable combination of hardware and software.

After the layout pattern is determined to conform to the design rules by the DRC module 158, the layout pattern 162 is passed to a reticle generator 164 in a form that is readable by the radical generator. For example, the layout may be in a GDSII format. The reticle generator then forms a plurality of reticles 165 based on the layout pattern 162. The reticles may then be used by one or more process tools 166 to at least partially fabricate one or more die(s) and integrated targets 167. The integrated die(s) and targets may then be provided to one or more inspections or metrology tools 168 so that the targets may be inspected or measured. Of course, the reticle targets 165 may also be inspected or measured. The inspection and metrology results obtained from the targets are representative of the active regions within the die.

Location data 172 for each target is also provided to the inspection or metrology tools 168 so that the targets may be found by the tool. In one specific embodiment, the location data is retained in fabrication database 170, which is accessible by the inspection or metrology tools 168. Alternatively, the location data may be directly provided or transferred to the inspection or metrology tools 168.

The process 104 for inserting target layout patterns into the die layout pattern has been described in detail in the above-referenced patent application and will therefore not be repeated here. In general, the targets are placed into the die in accordance with some type of target rules. These target rules preferably include a requirement that the target be placed in a layer which is measurable or inspectable by a particular type of tool. For example, the target may have to be on a top layer or be covered with only optically transparent layers so that the target may be inspected by an optical tool. In other applications, the target may be required to be underneath an opaque layer so that the opaque layer's conformance to the underlying target may be inspected and/or measured. Additionally, each inspection, review, or metrology tool typically has a size constraint as to the measured or inspected structure. That is, structures below a particular size cannot be seen. Therefore, the targets must be sized so that they can be measured or inspected by the relevant tool. Typically, the in-chip overlay target is required to be smaller than 3 microns.

As micro targets are used in-chip, it is desirable to take proximity effects into account with respect to overlay measurement methodology. The overlay shift between various portions of the target distorts the symmetry of the targets and may make it impossible to obtain an accurate overlay measurement using conventional approaches. For example, due to the strong proximity effects it is complicated to design a target having lines/trenches of both boxes to be extended in the same direction. If the target structures of both layers were extended in the same direction such as a conventional box-in-box target, a relative shift of lines/trenches in, for example, the y-direction would change the signal obtained by image projection in this direction. This would in turn affect the overlay measurements in the x-direction. Accordingly, such a target would not provide decoupling between overlay measurements in x- and y-directions.

Figure 2:
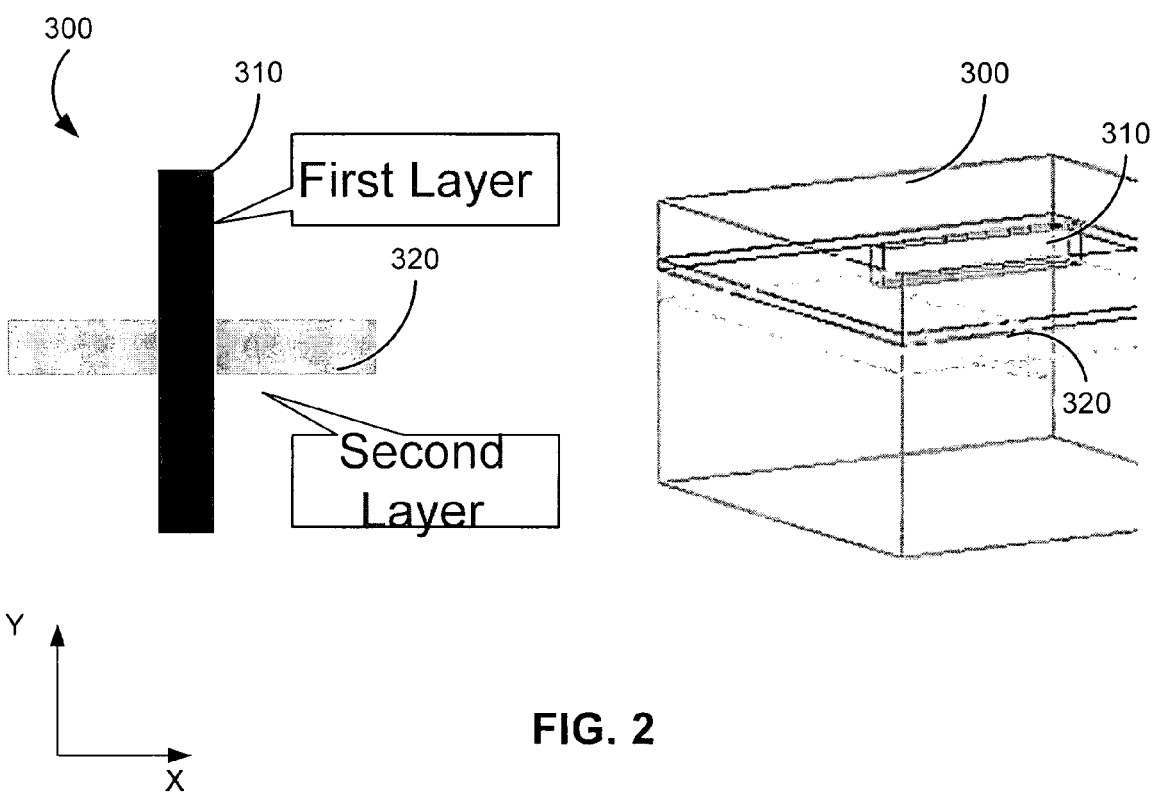
FIG. 2 shows a schematic example of a cross-shaped target in accordance with one embodiment of the invention.

Therefore, in accordance with one embodiment of the invention, a micro target is provided that is designed such that all structures of the first layer extend in one direction whereas all structures of the second layer extend in another, perpendicular, direction. In some embodiments, the targets are designed to fit within relatively small open areas of the active region. Towards this end, the micro targets in their simplest form include a single line or trench structure in the first layer and a single line or trench structure in the second layer, wherein the different line/trench structures extend in a different direction. In other more complex examples, the micro target contains a plurality (e.g., two) of line/trench structures in each of two layers. In several micro target embodiments, the structures are three dimensional structures that are present in a first layer and a second layer; the first layer is displaced in the z direction with respect to the second layer; and the first layer structure(s) are on top of the second layer structure(s). For instance, the line structures of each layer referred to herein are really three dimensional block structures that are perpendicular to and over each other. One example of the simplest target type is a cross-shaped target (300), as shown in FIG. 2, where the first layer structure (310) extends in a y-direction and the second layer structure (320) extends in an x-direction. Generally (but it doesn't have to be) the projections of target images on the x-axis are used for determining OVL in x-direction, whereas image projections on the y-axis for determining overlay in y-direction. As described further below, the overlay in the x-direction is not affected by changes in asymmetry or overlay of the structures that extend in the y-direction, and visa versa.

Figure 3A:
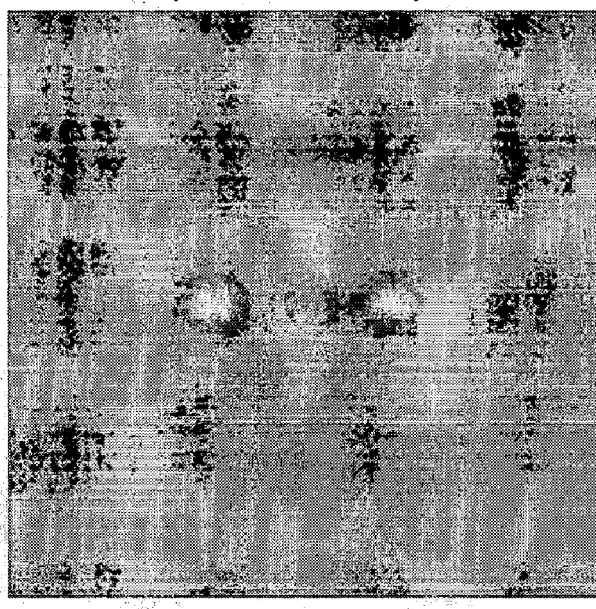
FIGS. 3A and 3B show two images of a cross-shaped target in accordance with one embodiment of the invention.
Figure 3B:
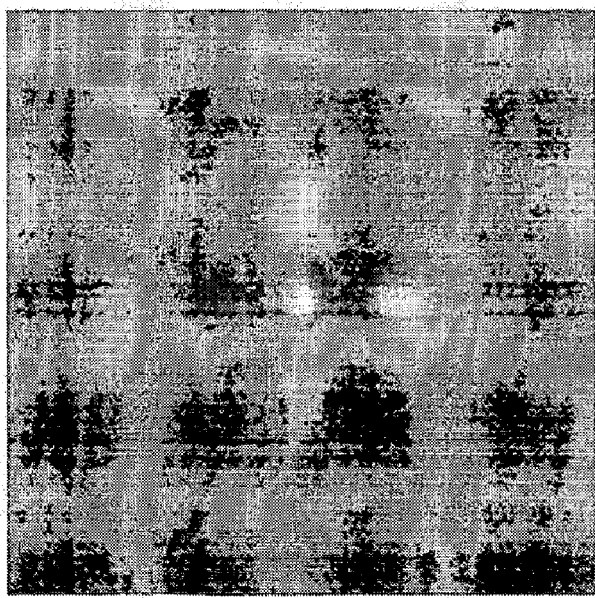
Figure 4A:
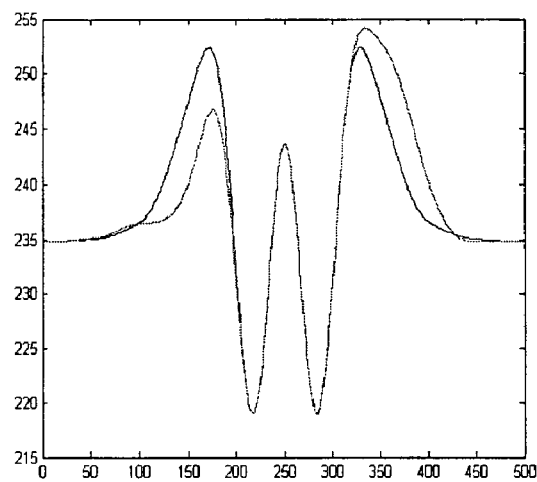
FIGS. 4A and 4B show two projections of cross target images of FIGS. 3A and 3B on the x-axis and y-axis, respectively.
Figure 4B:
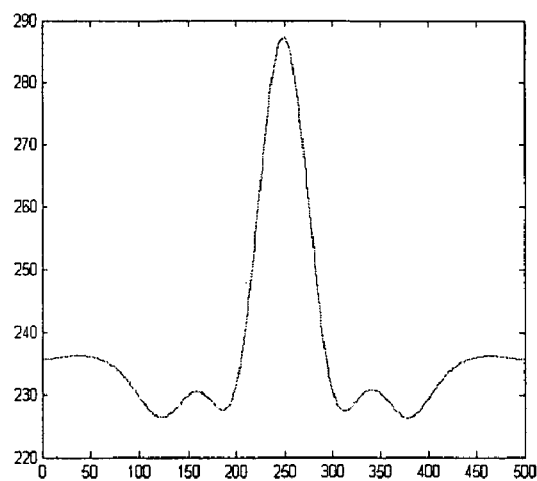

FIGS. 3A and 3B show two simulated images of cross target (300). In FIG. 3A, the cross target (300) is symmetric. That is, the structures of FIG. 3A have zero overlay. In FIG. 3B, the vertical bar of the cross target (310) has been shifted by −200 nm in the x-direction with respect to the horizontal bar (320). Projecting the cross target images in FIGS. 3A and 3B along the x-axis and the y-axis, respectively, results in the curves shown in FIGS. 4A and 4B, respectively. As can be seen in FIG. 4A, when projecting along the x-axis, the asymmetry caused by the overlay shift in the x-direction (i.e., FIG. 3B) gives rise to a curve that is different from the curve representing zero overlay (i.e., FIG. 3A). However, this asymmetry cannot be seen in FIG. 4B, which is a projection along the y-axis of the two images in FIGS. 3A and 4B, respectively. Thus, it is clear that the target design in accordance with embodiments of the invention provides the required decoupling between overlay shifts in the x- and y-directions, respectively.

Figure 5:
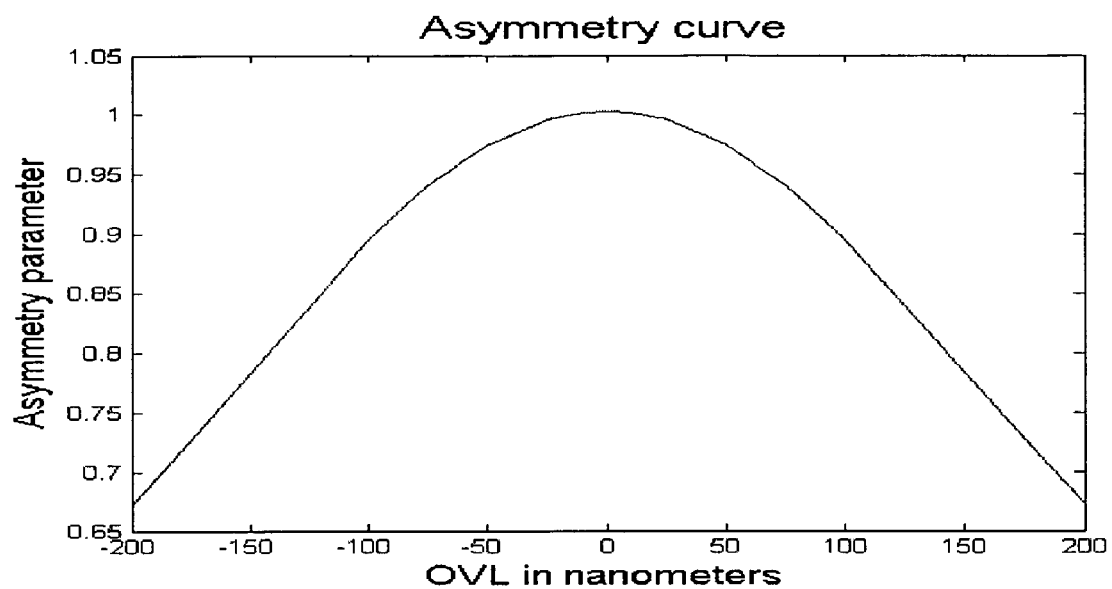
FIG. 5 shows a fitted asymmetry calibration curve determined for the projections in FIG. 4A.

An overlay measurement approach based on target asymmetry requires providing a model that allows a conversion to be made of target symmetry properties into overlay values. That is, it has to be possible to characterize the level of asymmetry by some number. In one embodiment of the invention, the value of maximum normalized correlation between the plurality of signals having known offsets (such as the micro targets of FIGS. 3A and 3B) and their flipped counterparts is converted into overlay values. The resulting dependence of target asymmetry defined in this way on overlay is shown in FIG. 5. Since this parameter is a monotonic function of the overlay shift, it is suitable for a calibration procedure. It should be noted that the value of maximum correlation does not depend on the sign of the overlay shift and hence, the sign of overlay shift must be added to the calibration curve.

In one embodiment of the invention, two general approaches for model building and overlay measurement are provided. In the first approach, an array of overlay marks with predefined overlay values are printed in a specific place, such as the scribe line, on the wafer. These overlay marks are designed to decouple asymmetry in an x direction from asymmetry in the y direction as described above. When these types of marks are used, the number of marks can be minimized. In one implementation, the array includes, for example, 20 targets with 10 nm offset step to cover +−100 nm OVL range. A calculation of the target asymmetry parameter for each one of the targets in the array is then performed. A calibration curve is determined by setting a zero overlay value to correspond to the center of symmetry for the curve. The obtained calibration curve can then be used as a reference in overlay measurements for a single micro-target placed within the active area or any other suitable area of the wafer.

Figure 6:
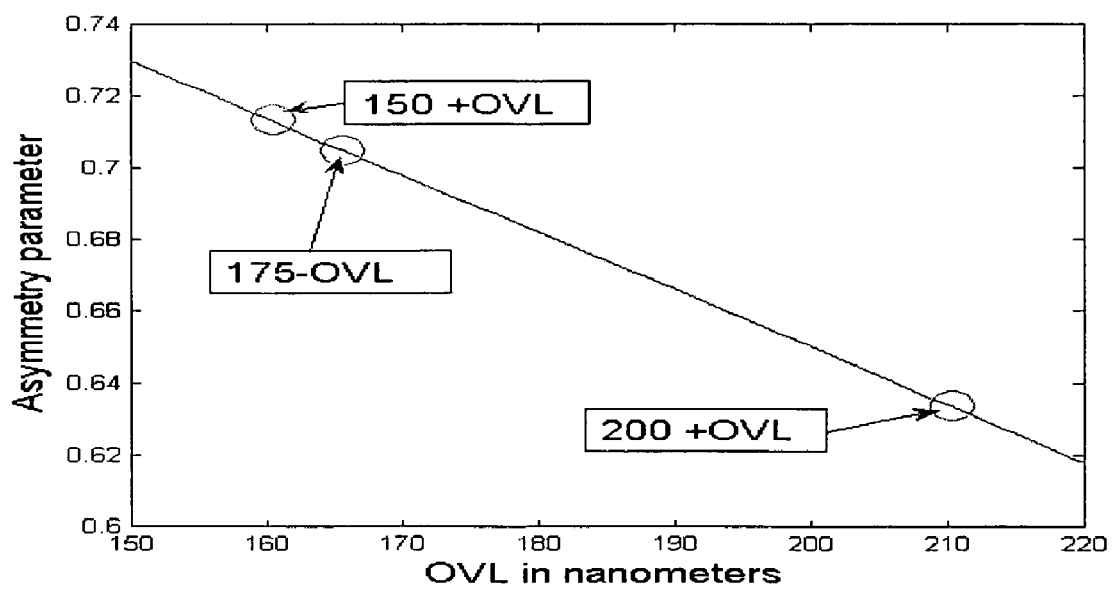
FIG. 6 shows a calibration curve in accordance with one embodiment of the invention.

The second general approach involves printing an array of targets with predefined overlay values within the active area, for example, as a set of inactive dummy structures. This can be done in a number of ways. In one embodiment, the quasi-linear behavior of the calibration curve for large overlay values, which can be seen in FIG. 5, is used. Three targets with predefined overlay values, for example, −175, 150 and 200 nm are then printed on the wafer. After subjecting these targets to overlay shift, their actual overlay values become −175+overlay, 150+overlay and 200+overlay, respectively. Since the calibration curve is symmetric with respect to the sign of the overlay values, the respective actual overlay values are equivalent to the 175−overlay, 150+overlay and 200+overlay, as shown in FIG. 6. By measuring a parameter of symmetry for each one of these printed targets, it is possible to find the overlay shift.

In another embodiment, the array of targets is arranged such that each subsequent target has a predefined overlay value which is larger than the previous one by some constant value which can be referred as the "overlay step" ($\Delta P$). In particular, the target array can be designed using some distance (or pitch size) P for upper layer structures and another distance P+$\Delta P$ for bottom layer structures. Measuring a distance (D) between the position of a target in the array designed for zero overlay and a position in the array where the maximum of the calibration curve occurs provides the raw data required for calculating the overlay value. The details of a technique for determining overlay will now be described with reference to FIGS. 7A and 7B, which illustrate an exemplary embodiment using two target arrays. It should be noted that since it is not known what part of the array is in the field of view, there must be some type of identification code of predefined overlay values corresponding to one of the targets. One example of such an identification code is a distance between subsequent targets. Since the accuracy of target center location measurement is in the nanometer order of magnitude, differences of about 50-100 nm in distance between, for example, zero overlay target and the subsequent target in the array is typically sufficient for target identification.

Figure 7A:
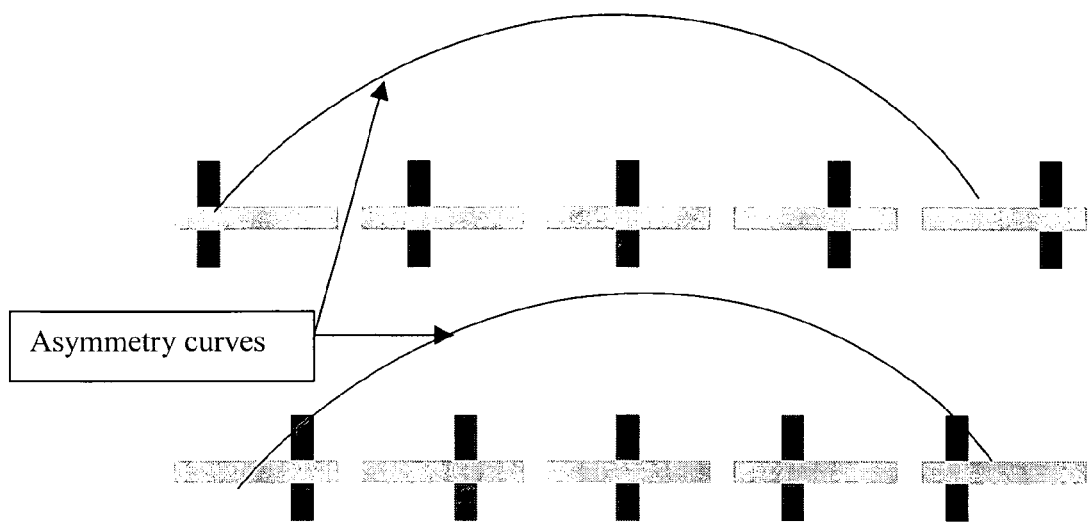
FIGS. 7A and 7B show exemplary target structures and calibration curves in accordance with one embodiment of the invention.

As can be seen in FIG. 7A, in one embodiment two target arrays are provided. The first array is constructed as described above, whereas the second array has the same but negative $\Delta P$ between the subsequent targets in the array, i.e. the vertical bars move in opposite directions relative to their horizontal bars when moving away from the center of the figure. The two target arrays of FIG. 7A show zero overlay shift, excluding the offsets.

Figure 7B:
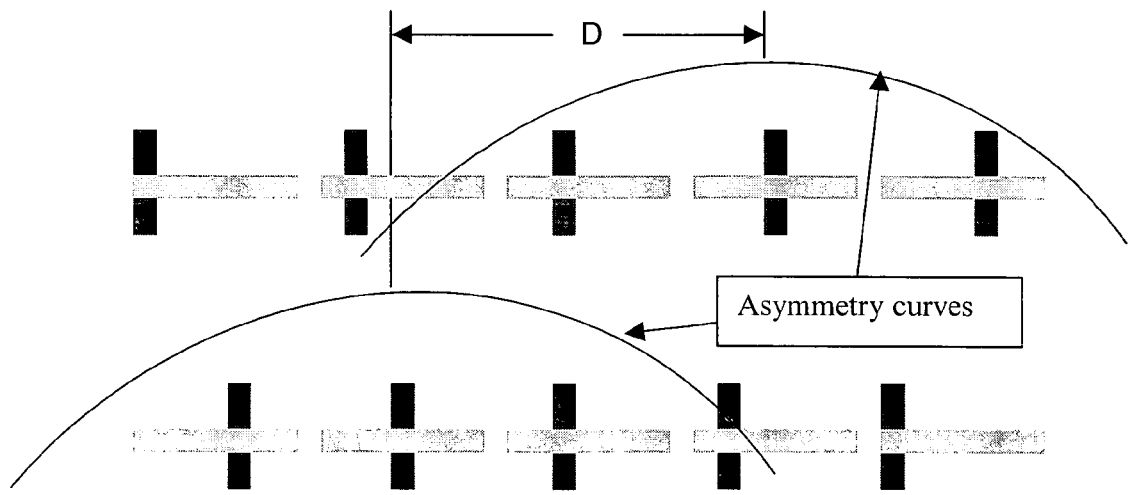

In contrast, in FIG. 7B, in one embodiment two target arrays with a negative overlay shift are provided. Just like in FIG. 7A, the first array is constructed as described above, whereas the second array has the same but negative $\Delta P$ between the subsequent targets in the array, i.e. the vertical bars move in opposite directions relative to their horizontal bars when moving away from the center of the figure. Here, however, it can be seen that the centers of symmetry for the two asymmetry curves are displaced by a distance D, that is, there is a negative overlay shift. The value of overlay can be found as a half the distance between the centers of symmetry of the two arrays multiplied by the ratio of $\Delta P$ and targets array pitch P, that is:

$$\text{overlay} = D * \Delta P / 2 / P$$

The main advantage of this approach is that no target identification is needed, which makes it possible to obtain significant tool performance improvements. It should be noted that a graphical presentation of target arrays as line arrays is not required. In some implementations targets can be placed in different order or even arbitrarily in FOV. In order to analyze these targets, they have to be arranged in order according to the value of asymmetry parameter and the sign of OVL for each individual target. In order to distinguish between two arrays with different signs of OVL offset step, all predefined values of OVL offsets for one of the arrays can be shifted, for example, by half an OVL offset step. Alternatively, the second array can be printed with inverse correspondence of vertical and horizontal bars/trenches to the top and bottom layers Any suitable symmetry or asymmetry parameter may be measured on the calibration targets in the above described calibration techniques. One example of asymmetry parameters includes the distance between an asymmetrical imaged feature and a center point as obtained from the maximum symmetric target image. For instance, the center point of the most symmetrical image signal is determined, and then the most symmetrical image signal and center point is overlaid the other asymmetrical image signals to determine distance between the center point and a particular asymmetrical feature.

It should be noted that in all embodiments discussed above the same calibration targets can be used for overlay determination in both directions. That is, projections of the images on the x-axis that serve for overlay determination in the x-direction do not affect projection of the images on the y-axis that serve for overlay determination in the y-direction, and vice versa. In order to implement the overlay determination and calibration procedures that are described above, a micro target design must ensure an independence of the signal obtained by image projection in any direction from overlay shifts in the same direction. Otherwise instead of one or two target arrays needed for the calibration procedure in x- and y-directions, it would be necessary to use a whole matrix including all combinations of x- and y-overlay shifts. Using a matrix including all possible combinations of x-and y-overlay shifts would exclude any possibility for on the fly calibration procedures and make any off-line calibration procedures cumbersome and time-consuming.

The techniques of the present invention may be implemented in any suitable combination of software and/or hardware system, such as an optical or scanning electron microscopy (SEM) imaging system. Regardless of the system's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store layout patterns, layout constraint rules and target rules.

Because such information and program instructions may be employed to implement the systems/methods described herein, the present invention relates to machine-readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave traveling over an appropriate medium such as airwaves, optical lines, electric lines, etc. Examples of program instructions include both machine code, such as produced by a compiler, and files containing higher level code that may be executed by the computer using an interpreter.

A number of embodiments of the invention have been described. Nevertheless, it will be understood by those skilled in the art that various modifications may be made without departing from the spirit and scope of the invention. For example, for the two arrays option described above, the only requirement is to ascertain that the distance between subsequent targets from the array is the same. This can be achieved, for example, by designing the target arrays as a periodic chain of targets where, for example, resist layer structures are placed with a period P, and the process layer structures are placed with period P+$\Delta$P for one array and P−$\Delta$P for another array. Accordingly, other embodiments are within the scope of the following claims.

What is claimed is:

1. A method for generating a calibration curve for use in an overlay measurement, the method comprising:
    printing a first array of targets on a wafer;
    calculating a target asymmetry parameter value for each of the targets in the array of targets;
    generating a first calibration curve including the calculated target asymmetry parameter values, wherein a center of symmetry of the first calibration curve corresponds to a zero overlay;
    printing a second array of targets on a wafer, wherein a-pitch of the first array of targets is different from a pitch of the second array of targets;
    generating a second calibration curve including the calculated target asymmetry parameter values for the second array of targets, wherein a center of symmetry of the second calibration curve corresponds to a zero overlay;
    measuring a distance between the respective centers of symmetry for the first and second calibration curves; and
    calculating an overlay value based on the distance between the respective centers of symmetry of the first and second calibration curves and a ratio of pitch difference between the first and the second arrays of targets to either the first or the second array pitch.

2. A method as recited in claim 1, wherein printing a second array comprises:
    printing a second array of targets having the same pitch values as the targets in the first array of targets, but having an opposite sign.

3. A method as recited in claim 1, wherein printing includes printing both the first and second target arrays in arbitrary order within an active region of the wafer, and further comprising:
    measuring a symmetry parameter value for each target in each of the first and second target arrays; and
    sorting the targets within each of the first and second target arrays using the measured symmetry parameter values.

4. A method for generating a calibration curve for use in an overlay measurement, the method comprising:
    printing a first array of targets on a wafer;
    calculating a target asymmetry parameter value for each of the targets in the array of targets;
    generating a first calibration curve including the calculated target asymmetry parameter values, wherein a center of symmetry of the first calibration curve corresponds to a zero overlay;
    using the first calibration curve as a reference in overlay measurements for individual arrays of targets;
    printing a second array of targets, wherein a first portion of the second array corresponding to the first portion in the first array is printed in the second layer of the wafer, and a second portion of the second array corresponding to the second portion of the targets in the first array is printed in the first layer of the wafer;

generating a second calibration curve including the calculated target asymmetry parameter values for the second array of targets, wherein a center of symmetry of the curve corresponds to a zero overlay;

measuring a distance between the respective centers of symmetry for the first and second calibration curves; and calculating an overlay value based on the distance between the respective centers of symmetry of the first and second calibration curves and a ratio of pitch difference between the first and the second arrays of targets to either the first or the second array pitch, wherein a first portion of each target is printed in a first layer of the wafer, and a second portion of each target is printed in a second layer of the wafer.

* * * * *